United States Patent [19]

Hasegawa

[11] Patent Number: 4,772,874
[45] Date of Patent: Sep. 20, 1988

[54] KEYBOARD APPARATUS

[75] Inventor: Hiroshi Hasegawa, Urawa, Japan

[73] Assignee: Topre Corporation, Tokyo, Japan

[21] Appl. No.: 129,901

[22] Filed: Dec. 7, 1987

Related U.S. Application Data

[63] Continuation of Ser. No. 704,215, Feb. 22, 1985, abandoned.

[30] Foreign Application Priority Data

Feb. 29, 1984 [JP] Japan .................. 59-37614

[51] Int. Cl.⁴ .................................................. G08B 7/06
[52] U.S. Cl. ........................... 340/365 S; 340/365 C;
340/365 E
[58] Field of Search ............ 340/365 S, 365 R, 365 C,
340/365 E; 364/189, 700, 709; 400/473, 479,
485

[56] References Cited

U.S. PATENT DOCUMENTS

| | | | |
|---|---|---|---|
| 3,757,322 | 9/1973 | Barkan et al. | 340/365 C |
| 3,918,051 | 11/1975 | Bernin et al. | 340/365 E |
| 4,106,011 | 8/1978 | Melanson et al. | 340/365 S |
| 4,263,582 | 4/1981 | Dumbovic | 340/365 S |
| 4,302,011 | 11/1981 | Pepper, Jr. | 340/365 C |
| 4,502,039 | 2/1985 | Vercesi et al. | 340/365 E |
| 4,520,906 | 1/1985 | Deforeit | 340/365 C |

FOREIGN PATENT DOCUMENTS 48-64838 9/1973 Japan .
55-49732 4/1980 Japan .

OTHER PUBLICATIONS

J. T. Rowe, Jr.—"Dynamic Updating of Key-Sensing Thresholds"—vol. 27, No. 4A, Sep. 1984—pp. 2012-2018.

Primary Examiner—Gerald L. Brigance
Assistant Examiner—Mahmoud Fatahiyar
Attorney, Agent, or Firm—Oblon, Fisher, Spivak, McClelland, & Maier

[57] ABSTRACT

A capacitive keyboard apparatus including a plurality of keys and a matrix of capacitive switches arranged in columns and rows and connected to the keys, respectively, wherein first and second drive signals sweep the columns of switches and first and second matrix output signals are generated from the rows of switches as the result of first and second drive signal supplied, provided that any key has been depressed during the sweeping. The first and second matrix output signals are converted to first and second logic signals, respectively, each of which has a pulse width proportional to how deeply the key has been depressed. When the first logic signal has a pulse width broader than a first predetermined width, the second drive signal sweeps the columns of switches. It is determined that the key has been depressed and a key-code corresponding to the depressed key is output, when the second logic signal has a pulse width broader than a second predetermined width and when the second keys during the sweeping by the first and second drive signals are identical.

14 Claims, 5 Drawing Sheets

KEYBOARD APPARATUS

This application is a continuation of application Ser. No. 704,215 filed Feb. 22, 1985 now abandoned.

BACKGROUND OF THE INVENTION

This invention relates to a keyboard apparatus, and more particularly to an improved capacitive-keyboard apparatus which detects the depression of a key from changes in electrostatic capacitance.

Keyboard apparatus have been used as input devices for inputting codes of characters, symbols, etc., to electronic computers. Each has a number of keys arranged substantially in one plane. Characters, numerals, symbols, signs, etc., are allotted to these keys. When any key is depressed, the apparatus outputs the code of the character, numeral, symbol or the like allotted to this key. An apparatus of this type has mechanical contacts.

Recently, a keyboard apparatus with capacitive switches has come into use. This apparatus is durable and has a good key touch. It includes keys connected to the capacitive switches, a sense amplifier, and a comparator with a specific hysteresis characteristic. Each switch has two electrodes. When any key is pushed, the interelectrode capacitance of the switch coupled to this key changes. The sense amplifier detects this change in the form of a voltage. It amplifies the voltage to a predetermined value. The amplified voltage is supplied to the comparator circuit and compared with a reference voltage. The comparator outputs the difference between the voltages as a key-depression signal.

It is demanded that the keyboard apparatus detect any key depression without fail. When one key is quickly depressed several times, the apparatus must generate the same number of key-depression signals even if the operator's finger touching the key shakes. To meet this demand, a new type of keyboard apparatus has been invented. In this apparatus, a comparator compares a voltage signal generated by depressing a key with its threshold voltage, and outputs a signal when the input signal reaches the threshold voltage. Then, the threshold voltage is lowered to a specified value. The comparator outputs a second signal upon lapse of a predetermined time from the threshold voltage change, and the apparatus then outputs a key-depression signal. However, when each capacitive switch is of the type that its interelectrode capacitance changes slowly as the corresponding key is depressed, the apparatus may output an erroneous key-depression signal.

SUMMARY OF THE INVENTION

Accordingly, the object of this invention is to provide a keyboard apparatus which can detect the depression of any key even if the interelectrode capacitance of the capacitive switch coupled to the key slowly changes.

In the keyboard apparatus of this invention, a pulse signal is generated when any key is depressed. The deeper the key is depressed, the greater width this pulse signal has. The pulse signal is converted into a logic voltage signal, whose pulse width is proportional to how deeply each key has been depressed. This signal is sampled twice, thereby determining whether or not the pulse width is greater than a predetermined value. The apparatus outputs a key-code corresponding to this key only when the pulse width is over the predetermined value.

According to the invention, there is provide a capacitive keyboard apparatus comprising a plurality of capacitive switches, each being coupled to a key and having an electrostatic capacitance varied in proportion to the depth to which the key has been depressed: a switch matrix including the capacitive switches arranged in columns and rows: drive signal supplying means connected to the columns of the switch matrix for sequentially supplying a drive signal to the columns, wherein a pulse signal having a pulse width varied in proportion to the depth, to which any key of the switch matrix has been depressed, is generated as a matrix output signal from the drive signal and supplied to the row to which the depressed key is connected; selection means connected to the rows of the switch matrix for sequentially selecting the rows, thereby to select the matrix output signals which have been generated and supplied to the rows; signal converting means connected to the selection means for converting each matrix output signal selected by the selection means into a logic signal whose pulse width is proportional to the pulse width of the matrix output signal; first judging means connected to the signal converting means for receiving the logic signal and determining whether or not the pulse width of the logic signal is broader than a first predetermined width which corresponds to the width to be determined that the key has been depressed; second judging means connected to the signal converting means for receiving the logic signal and determining whether or not the pulse width of the logic signal is broader than a second predetermined width which is narrower than the first predetermined width; and control means connected to the drive signal supplying means, the selection means, the first judging means, and the second judging means, for controlling the driving signal supplying means thereby to sequentially supply a first drive signal to the columns of the switch matrix, for controlling the selection means thereby to select the matrix output signal generated by depressing any key of the switch matrix in accordance with the first drive signal, for controlling the driving signal supplying means thereby to sequentially supply a second drive signal to the columns of the switch matrix when the first judging means determines that the logic signal generated from the matrix output signal, which has been generated by depressing the key of the switch matrix in accordance with the first drive signal, has a pulse width broader than the first predetermined width, for controlling the selection means thereby to select the matrix output signal generated by depressing the key of the switch matrix in accordance with the second drive signal, for determining in accordance with the first and second logic signals, whether the keys depressed are identical or not when the second judging means determines that the logic signal, generated in accordance with the second drive signal, has a pulse width broader than the second predetermined width, and for outputting a key code corresponding to these keys when these keys are determined to be identical.

In this invention, any logic signal, whose width depends on how deeply the key has been depressed, is sampled twice to form hysteresis, and a key-code signal is output only when key-depression signals are obtained twice in each sampling of the logic signal. Hence, when pulses are generated from noise, induction, chattering, etc., no key-detection signal is generated since these pulses have a width shorter than a predetermined width.

DETAILED DESCRIPTION OF THE PREFERRED EMBODIMENTS

A few embodiments of the invention will now be described in detail with reference to the accompanying drawings.

Figure 1:
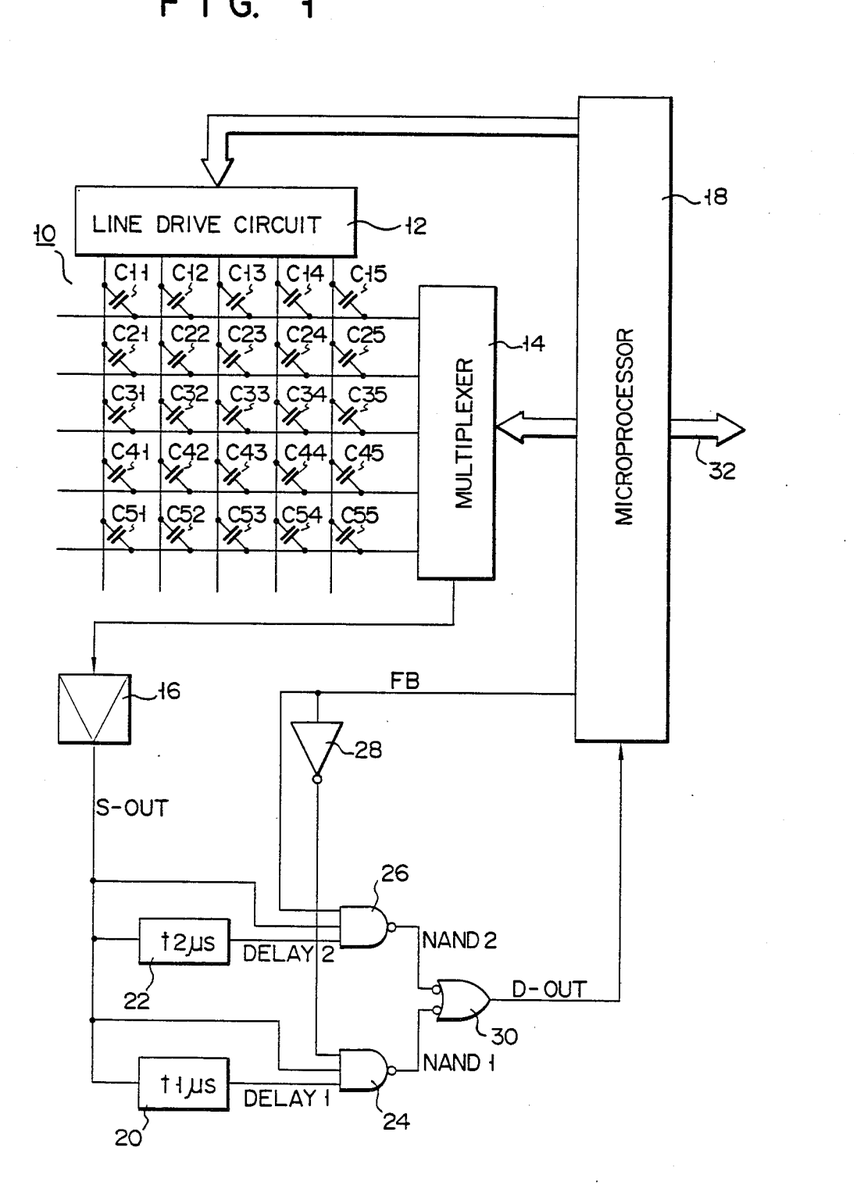
FIG. 1 schematically shows a keyboard apparatus according to the present invention.

FIG. 1 schematically show a keyboard apparatus. This apparatus has a capacitive switch matrix 10. Matrix 10 comprises twenty-five capacitive switches C11-C55 arranged in rows and columns, five row lines, and five column lines. Each switch has a fixed electrode connected to the corresponding row line and a movable electrode coupled to the corresponding column line. Twenty-five keys (not shown) are coupled to the movable electrodes of switches C11-C55. The movable electrode of any switch moves toward the fixed electrode as the key connected to it is depressed, thereby the interelectrode capacitance of this switch changes. More or less than 25 capacitive switches may be used. Further, each switch may have two fixed electrodes coupled to the row line and column line, and one movable electrode coupled to the corresponding key.

The apparatus further comprises a line drive circuit 12, a multiplexer 14, a sense amplifier 16 and a microprocessor 18. Circuit 12 supplies drive signals to the column lines. When any key is depressed, the switch coupled to this key produces a pulse signal in accordance with the drive signal because of change in interelectrode capacitance of this key. The pulse signal has a pulse width which depends on how deeply the key has been depressed. The pulse signal is supplied as a matrix output signal through the row line to multiplexer 14. Multiplexer 14 successively supplies the matrix output signal to sense amplifier 16. Line drive circuit 12 and multiplexer 14 are controlled by the address signals supplied from microprocessor 18. Under the control of microprocessor 18, circuit 12 and multiplexer 14 cooperate to select switches C11-C55, one after another. While circuit 12 is supplying a drive signal to each column line, multiplexer 14 sequentially selects all row lines. It starts selecting the row lines again whenever line drive circuit 12 supplies a drive signal to another column line.

Sense amplifier 16 amplifies every matrix output signal supplied from multiplexer 14 to the voltage level of the logic circuit connected to it. In other words, it converts to the matrix output signal whose pulse width is proportional to how deeply the key has been depressed, into a logic signal. Thereby the pulse width of the logic signal is proportional to how deeply the key has been depressed. Since amplifier 16 outputs a pulse having a width of about 4 microseconds when the key has been deeply depressed, and a narrower pulse when the key has not been fully depressed.

Figure 2:
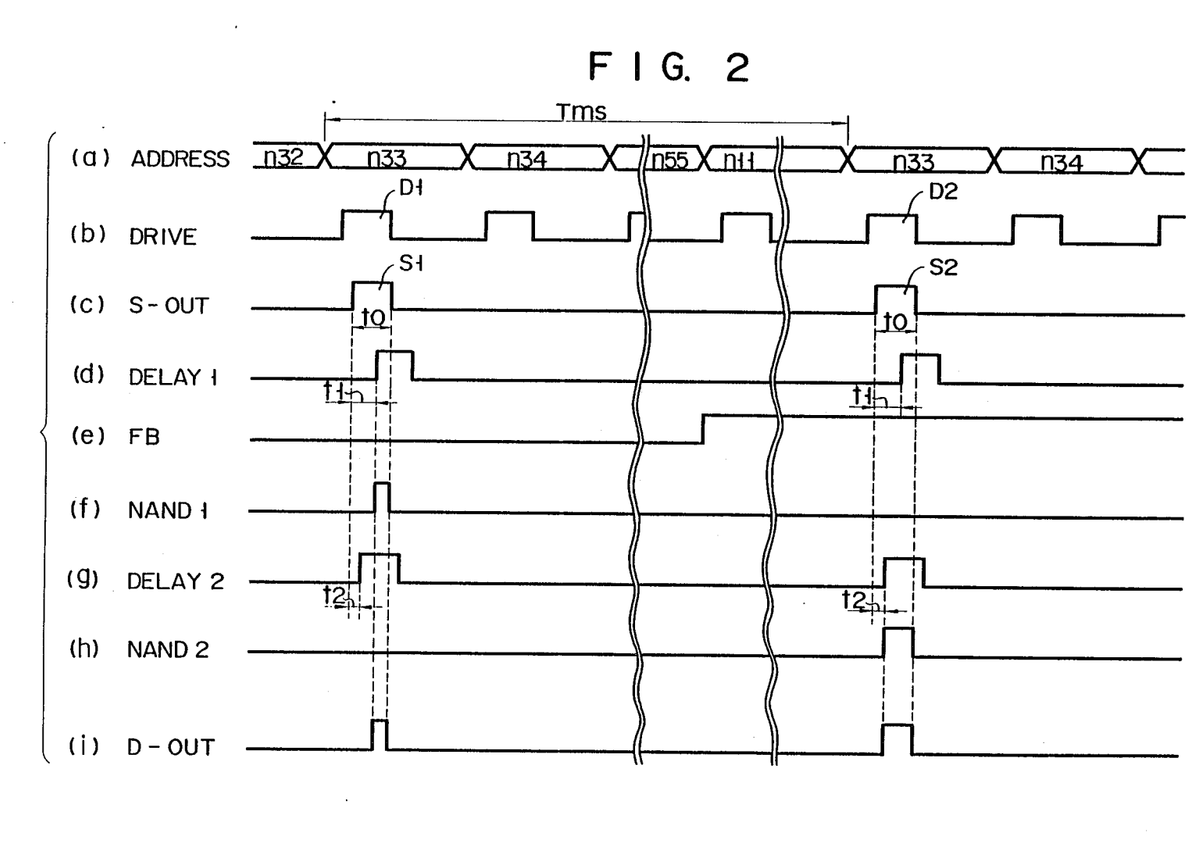
FIG. 2 is a timing chart illustrating how the apparatus of FIG. 1 operates.

Microprocessor 18 supplies address signals to line drive circuit 12 and multiplexer 14 as shown in FIG. 2(a). Line drive circuit 12 supplies drive signals to the column lines as shown in FIG. 2(b), under the control of the address signals. When the movable electrode of any switch, e.g., switch C33, is moved down, sense amplifier 16 produces a first logic signal S1 and a second logic signal S2 by this key being depressed respectively from first and second drive signals D1 and D2 supplied at a time interval of T milliseconds (Tms to the column line to which switch C33 is coupled. The pulse width t0 of these signals S1 and S2 is about 4 microseconds. Each logic signal is delayed by a first delay element 20 having delay time t1 of 2.5–3 microseconds and a second delay element 22 having delay time t2 of about 1 microsecond. The output of these elements, i.e., signals DELAY1 and DELAY2 shown in FIGS. 2(d) and 2(g), are supplied to first input of a 3-input NAND gate 24 and the first input of a 3-input NAND gate 26. Logic signal S-OUT is supplied to the second inputs of NAND gates 24 and 26. Further, microprocessor 18 supplies a feedback signal FB shown in FIG. 2(e) to the third input of NAND gate 24 through an inverter 28, and directly to the third input of NAND gate 26. Output NAND1 of NAND gate 24, which is shown in FIG. 2(f), is supplied to the first input of a 2-input OR gate 30. Output NAND2 of NAND gate 26, which is shown in FIG. 2(h) is supplied to the other input of OR gate 30. This OR gate produces the logical sum of the input signals and supplies this sum as a key-depression signal D-OUT shown in FIG. 2(i) to microprocessor 18.

Delay time t1 of first delay element 20 is longer than delay time t2 of second delay element 22. It is shorter than the pulse width t0 of the logic signals, i.e., the sampling period of each output signal of sense amplifier 16. Period t0 is far shorter than the sweeping period T for all the columns and rows of capacitive switch matrix 10.

When the key coupled to switch C33 is depressed, three signals shown in FIGS. 2(c), 2(d) and 2(g) are generated. At this time, feedback signal FB is at a low level as shown in FIG. 2(e), and NAND gate 26 cannot to produce an output. Hence, output NAND1 of first NAND gate 24 is supplied through OR gate 30 as a key-detection signal D-OUT of first time to microprocessor 18. This signal D-OUT has a pulse width corresponding to the period between the leading edge of output DELAY1 of first delay element 20 and the trailing edge of the output of sense amplifier 16. In response to key-detection signal D-OUT of first time, microprocessor 18 causes line drive circuit 12 and multiplexer 14 to sweep the columns and rows of switches for the second time. Simultaneously, it outputs a feedback signal FB of the high level, which is supplied to the third input of NAND gate 24. As a result, NAND gate 24 cannot produce an output, regardless of the levels of the signals supplied to the other two inputs. On the other hand, NAND gate 26 produces an output, whereby OR gate 30 outputs a key-detection signal D-OUT of second time whose pulse width corresponds to the period between the leading edge of signal DELAY2 and the trailing edge of signal S-OUT, as illustrated in FIG. 2(i). Upon receipt of this signal D-OUT, microprocessor 18 determines that the key connected to the switch designed by the address signal (ADDRESS) has been depressed to a sufficient depth. It then outputs a key-code signal of switch C33 through a data bus 32.

When the keyboard apparatus is operated in ordinary typing, microprocessor 18 needs ten and odd milliseconds to output each key-code through data bus 32 after the corresponding key has been depressed. This period is more than two times longer than sweeping period T for all the columns and rows of capacitive switch matrix 10. Hence, switch matrix 10 can be swept twice during this period of ten and odd milliseconds, to thereby correctly identify the depressed key and to output the key-codde assigned to this key.

A first key-depression signal D-OUT may be supplied to the interruption signal input of microprocessor 18. This embodiment, which is identical in structure with the apparatus shown in FIG. 1, operates in the following manner.

Figure 3:
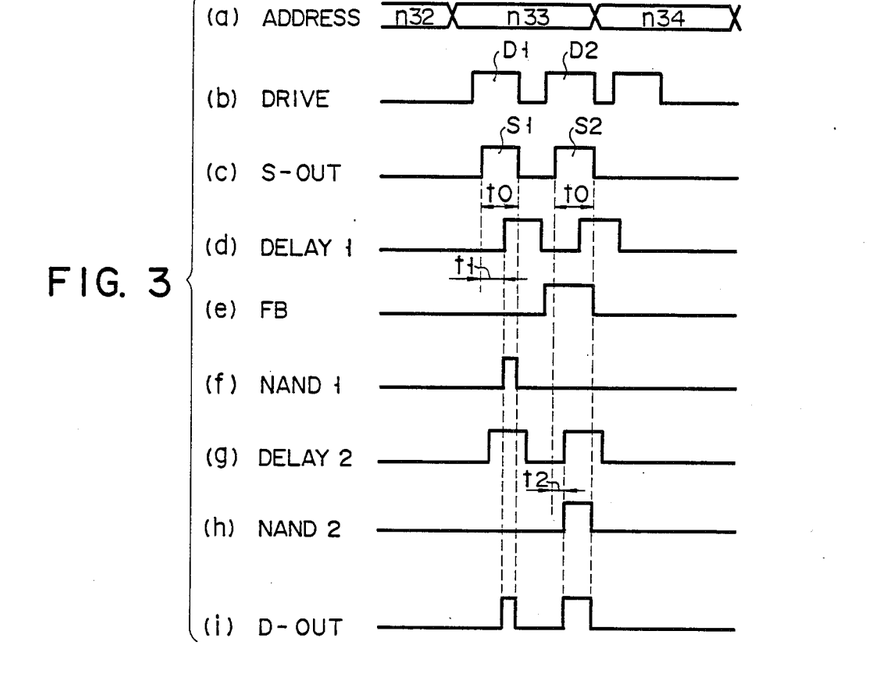
FIG. 3 is a timing chart explaining how another keyboard apparatus of the invention operates.

When capacitive switch C33 is depressed, three signals shown in FIGS. 3(c), 3(d) and 3(g) are produced. At this time, feedback signal FB is at a low level as illustrated in FIG. 3(e), and NAND gate 26 produces no output. On the other hand, NAND gate 24 outputs a first key-detection signal D-OUT whose pulse width corresponds to the period between the leading edge of output DELAY1 of delay element 20 and the trailing edge of the output of sense amplifier 16. This first signal D-OUT is fed via OR gate 30 to the interruption signal input of microprocessor 18. Upon lapse of a predetermined period from the receipt of the first signal D-OUT, microprocessor 18 outputs a second drive signal D2 shown in FIG. 3(b). It also produces a feedback signal FB synchronous with second drive signal D2 as shown in FIG. 3(e). Signal FB at a high level is supplied to the third input of NAND gate 24. Hence, NAND gate 24 cannot produce an output, irrespective of the levels of the signals supplied to the other two inputs. On the other hand, NANO gate 26 produces an output, whereby OR gate 30 outputs a second key-detection signal D-OUT whose pulse width corresponds to the period between the leading edge of signal DELAY 2 and the trailing edge of signal S-OUT, as illustrated in FIG. 3(i). When it receives the second key-detection signal, microprocessor 18 judges that the key coupled to switch C33 has been fully depressed. It generates a key-depression signal, which is output via data bus 32. In this embodiment, first key-detection signal D-OUT is an interruption signal to microprocessor 18, and drive signals are supplied to the column lines to which switch C33 is coupled, thus obtaining a second key-detection signal D-OUT.

In the first and second embodiments, NAND gate 24 produces a first key-detection signal D-OUT whose leading edge lags that of output S-OUT of the sense amplifier 16 by a relatively long period t1. Thus, when amplifier 16 produces an erroneous output having a pulse width shorter than period t1, first key-detection signal D-OUT is not produced. Therefore, when the keys are depressed for an extremely short time a little longer than ten and odd milliseconds which microprocessor 18 requires to output a key-code after the corresponding key has been depressed, it is not advisable to lengthen the delay time of second delay element 22. Rather, its delay time must be shortened, or element 22 may be dispensed with.

In the first and second embodiments, microprocessor 18 produces a feedback signal FB, outputs the key-code of any depressed key in response to output NAND2 and controls line drive circuit 12 and multiplexer 14. It performs all these operations in accordance with the program (software). Microprocessor 18 may be replaced by logic circuits. For instance, a delay circuit may be used to generate feedback signal FB, and an output circuit may be provided to output coded data in response to output NAND2 from the selected columns and raws of capacitive switches.

Figure 4:
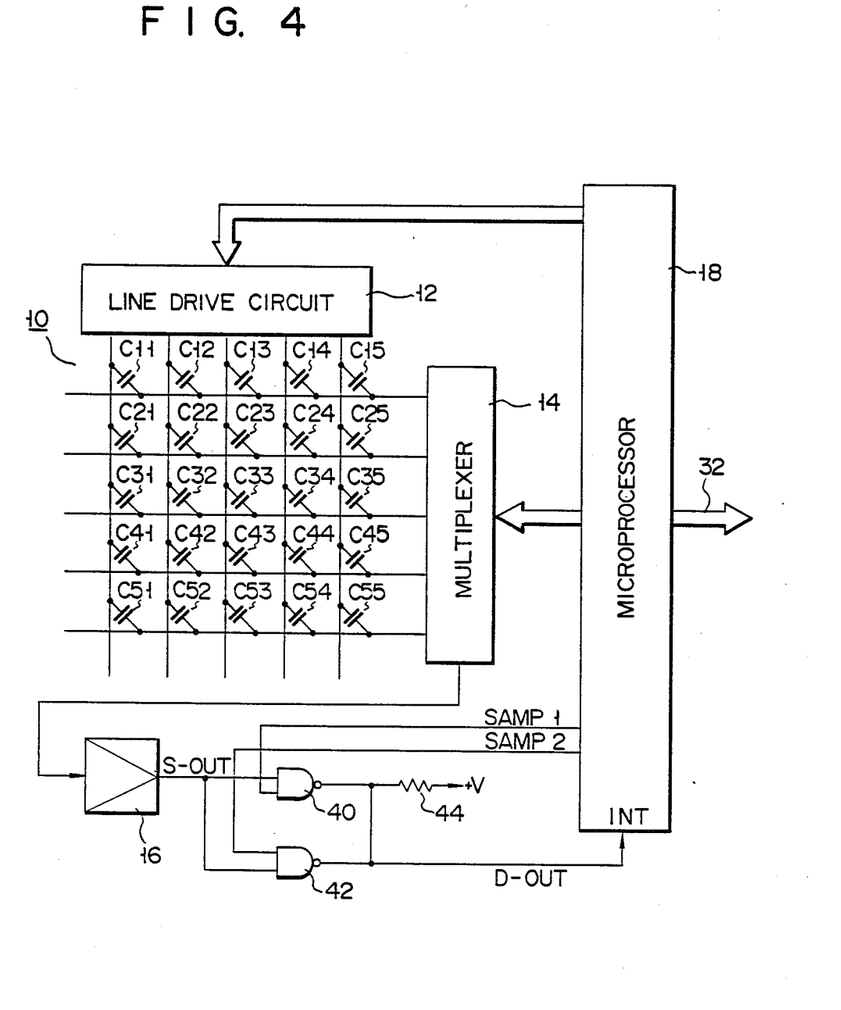
FIG. 4 schematically shows still another keyboard apparatus of the invention.

FIG. 4 shows the third embodiment of the invention.

Figure 5:
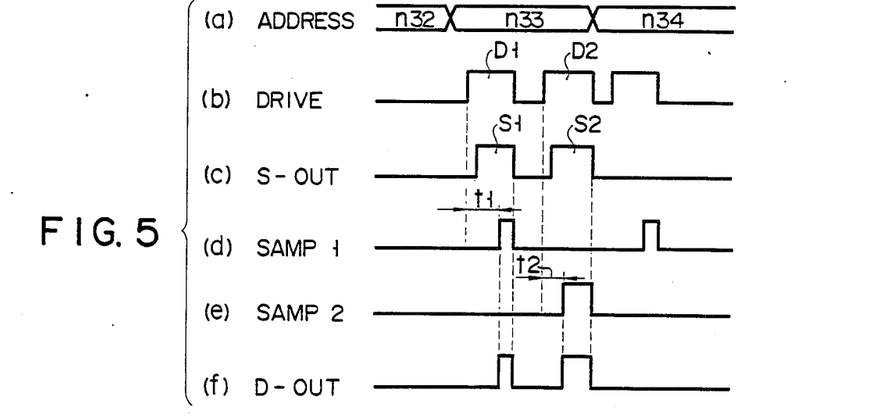
FIG. 5 is a timing chart showing the operation of the apparatus shown in FIG. 4.

This embodiment is different from the first and second embodiment only on two points. First, a microprocessor 18 generates first and second sampling pulses SAMP1 and SAMP2 to first and second judging means. Secondly, these pulses SAMP1 and SAMP2 are synchronous with first and second drive signals D1 and D2 as shown 1n FIGS. 5(d) and 5(e). Sense amplifier 16 outputs first and second logic signals S1 and S2 amplified the matrix output signals which are generated in accordance with drive signals D1 and D2 when the key coupled to switch C33 is depressed, respectively, as illustrated in FIG. 5(c). Logic signal S1 is supplied to the first input of a 2-input NAND gate 40, and logic signal S2 to the first input of a 2-input NAND gate 42. pulse SAMP1 is fed to the second input of NAND gate 40, and pulse SAMP2 is fed to the second input of NAND gate 42. The outputs of these NAND gates are connected and their node is coupled to a power supply +V by a resistor 44 and to the interruption signal input INT of microprocessor 18.

As shown in FIG. 5(d), microprocessor 18 outputs first sampling pulse SAMP1 upon lapse of time t1 after first drive signal D1 has been output. As illustrated in FIG. 5(e), it outputs second sampling pulse SAMP2 upon lapse of time t2 after second drive signal D2 has been produced. Time t1 is such that, even if the switch coupled to any depressed key undergoes capacitance changes due to chattering at the time of key depression or shaking of a finger, and the pulse width of output S1 of sense amplifier 16 therefore changes, the depression of the key can be correctly detected during the first sweeping of matrix 10, which is achieved by first drive signal D1. Time t2 is such that, even if the same switch undergoes capacitance changes due to chattering occurring at the time of the key releasing or shaking of a finger, and the pulse width of output S2 of sense amplifier 16 therefore changes, the depression of the key can be correctly detected during the second sweeping of matrix 10, which is achieved by second drive signal D2. Time t1 is longer than time t2.

Microprocessor 18 outputs an address signal designating a specific key. When an interruption signal D-OUT shown in FIG. 5(f) is supplied to its terminal INT after microprocessor 18 has output a first sampling pulse SAMP1, microprocessor 18 outputs a second sampling pulse SAMP2. If a second interruption signal D-OUT is supplied to terminal INT after second sampling pulse SAMP2 has been output, microprocessor 18 determines that the key designated by the address signal has been pushed. It therefore outputs a key-code signal through data bus 32. If both interruption signals D-OUT are not supplied to terminal INT in spite of pulses SAMP1 and SAMP2 output by microprocessor 18, microprocessor 18 judges that the key designated by the address signal has not been depressed.

Figure 6:
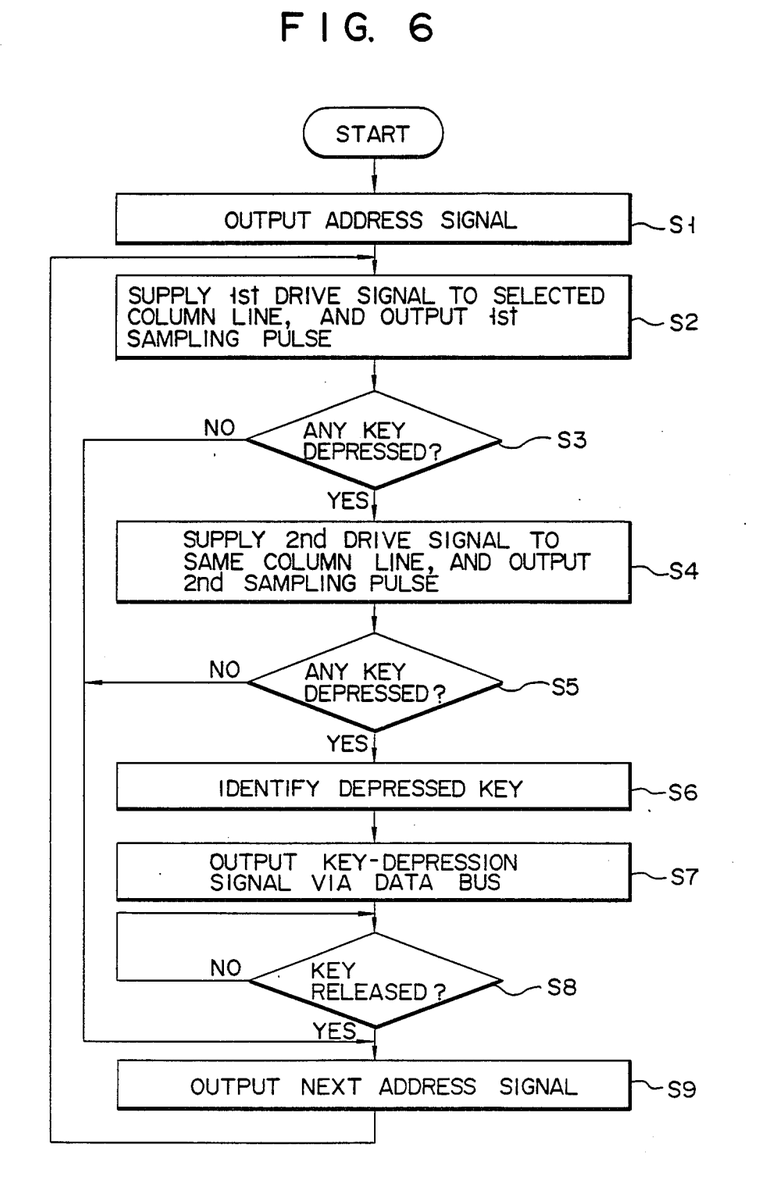
FIG. 6 is a flow chart illustrating how the apparatus of FIG. 4 operates.

The operation of the apparatus shown in FIG. 4 will be described with reference to the flow chart of FIG. 6. Suppose capacitive switch C11 is depressed. Microprocessor 18 outputs an address signal in step S1. In step S2, line drive circuit 12 supplies a first drive signal D1 to the first column line of switch matrix 10. When a multiplexer 14 selects the first row line, the signal output by switch C11 is supplied to sense amplifier 16 through multiplexer 14. Amplifier 16 therefore outputs a logic signal. Upon lapse of time t1 after signal D1 has been supplied, microprocessor 18 outputs a first sampling pulse SAMP1. NAND gate 40 therefore outputs an interruption signal D-OUT, which is supplied to input INT of microprocessor 18. In step S3, it is determined whether or not any key been pushed. If signal D-OUT is fed, it is judged that a key has been depressed. The answer to the question is "YES." Then, in step S4, circuit 12 supplies a second drive signal D2 to the first column line. When multiplexer 14 selects the first row line, amplifier 16 outputs a logic signal. Upon lapse of time t2 after signal D2 has been supplied, microprocessor 18 outputs a second sampling pulse SAMP2. As a result, NAND gate 42 produces an interruption signal D-OUT, which is supplied to input INT. In step S5, it is judged whether or not any key has been depressed. If signal D-OUT is supplied, it is judged that a key has been depressed. The answer to the question is "YES." Then, in step S6, microprocessor 18 judges that the key coupled to switch C11 has been depressed. In step S7, microprocessor 18 outputs a key-depression signal via a data bus 32. In step S8, microprocessor 18 determines whether or not the key coupled to switch C11 has been released. This step is repeated until the key is released. When the answer to the question is "YES," microprocessor 18 outputs an address signal to identify the next depressed key.

When the answer to the question asked in step S3 is "NO," the flow then jumps to step S9. In addition, when the answer to the question imposed in step S5 is "NO," the flow advances to step S9.

When any other key, e.g., the key connected to switch C12, is depressed, the depression of this key is detected in the same way as the key connected to switch C11. Also in this case, the depression of the key is detected only when two interruption signals are supplied to microprocessor 18 every time microprocessor 18 outputs two sampling pulses SAMP1 and SAMP2. Since output signals S-OUT resulting from chattering have to narrow a pulse width to be sample by sampling pulse SAMP1 or SMAP2, the aparatus does not output erroneous key-depression signals.

In the third embodiment, microprocessor 18 outputs second drive signal D2 and second sampling pulse SAMP2 when the logical product of first drive signal D1 and first sampling pulse SAMP1 is obtained. Alternatively, microprocessor 18 may be so designed as to automatically output first and second sampling pulses SAMP1 and SAMP2. If this is the case, the depression of any key is detected when the product of first drive signal D1 and first sampling pulse SAMP1 and the product of second drive signal D2 and second sampling pulse SAMP2 are obtained. Further, in the third embodiment, switch matrix 10 is swept only once to determine the depression of each key. Instead, matrix 10 may be swept twice for the same purpose. In this case, the address of the switch which has been identified by the first sweeping is supplied to line drive circuit 12, thus sweeping matrix 10 for the second time. When the same switch is identified again, then it is determined that the key coupled to this switch has been depressed. This method ensures a correct detection of any depressed key. Microprocessor 18 may output first and second sampling pulses SAMP1 and SAMP2 with time delay of t2 with respect to the first and second drive signals D1 and D2, respectively, during the second sweeping. This method ensures a correct detection of any depressed key even if the operator's finger touching on the key shakes during the second sweeping of switch matrix 10.

In the first to third embodiments of the invention, matrix 10 is swept twice in response to each output signal S-OUT of sense amplifier 16. Alternatively, switch matrix 10 may be swept several times in response to each output of amplifier 16. This method further ensures an accurate detection of every depressed key.

Still further, microprocessor 18 may be replaced by first and second decoders connected to line driver circuit 12 and multiplexer 14, respectively, and first and second binary counters connected to these decoders, respectively. The first decoder decodes the parallel-bit output data of the first counter, thereby causing circuit 12 to sweep column lines of switch matrix 10. Similarly, the second decoder decodes the parallel-bit output data of the second counter, thus causing circuit 12 to sweep the row lines of matrix 10.

Moreover, in the embodiments described above, the switch matrix 10 is swept twice when any key is depressed. Instead, the matrix 10 may be swept four times when any key is pushed, so that the depression of the key is more correctly detected.

What is claimed is:

1. A capacitive keyboard apparatus comprising:
a plurality of capacitive switches, each being coupled to a key and having an electrostatic capacitance varied in proportion to the depth to which the key has been depressed;
a switch matrix including said capacitive switches arranged in columns and rows;
drive signal supplying means connected to the columns of said switch matrix for sequentially supplying a drive signal to the columns, wherein a matrix output signal having a pulse width varied in proportion to the depth, to which any key of said switch matrix has been depressed, is generated from said drive signal and supplied to the row to which the depressed key is connected;
selection means connected to the rows of said switch matrix for sequentially selecting the rows, thereby to select the matrix output signals which have been generated and supplied to the rows;
signal converting means connected to said selection means for converting each matrix output signal selected by said selection means into a logic signal whose pulse width is proportional to the pulse width of the matrix output signal;
first judging means connected to said signal converting means for receiving the logic signal and determining whether or not the pulse width of the logic signal is broader than a first predetermined width which corresponds to the width to be determined that the key has been depressed;
second judging means connected to said signal converting means for receiving the logic signal and determining whether or not the pulse width of the logic signal is broader than a second predetermined width which is narrower than the first predetermined width; and
control means connected to said drive signal supplying means, said selection means, said first judging means, and said second judging means, for controlling said driving signal supplying means thereby to sequentially supply a first drive signal to the columns of said switch matrix, for controlling said selection means thereby to select the matrix output signal generated by depressing any key of said switch matrix in accordance with the first drive signal, for controlling said driving signal supplying means thereby to sequentially supply a second drive signal to the columns of said switch matrix when said first judging means determines that the logic signal generated from the matrix output signal, which has been generated by depressing the key of said switch matrix in accordance with the first drive signal, has a pulse width broader than the first predetermined width, for controlling said selection means thereby to select the matrix output signal generated by depressing the key of said switch matrix in accordance with the second drive signal, for determining in accordance with the first and second logic signals, whether the keys depressed are identical or not when said second judging means determines that the logic signal, generated in accordance with the second drive signal, has a pulse width broader than the second predetermined width, and for outputting a key code corresponding to these keys when these keys are determined to be identical.

2. The capacitive keyboard apparatus according to claim 1, wherein said control means causes said drive signal supplying means and said selection means to sweep all columns and all rows of said key switch for a second time in accordance with the second drive signal after said drive signal supplying means and said selection means have swept all columns and all rows of said switch for a first time in accordance with the first drive signal.

3. The capacitive keyboard apparatus according to claim 2, wherein said first judging means comprises first delay means for outputting a signal having a predetermined pulse width upon lapse of a first period of time after any logic signal has been generated and first logic operation means for performing a logic operation on the signal output from said first delay means and the logic signal and supplying the results of the logic operation to said control means; and said second judging means comprises second delay means for outputting a signal having a predetermined pulse width upon lapse of a second period of time after any logic signal has been generated, said second period of time being shorter than the first period of time, and second logic operation means for performing a logic operation on the signal output from said second delay means and the logic signal and supplying the results of the logic operation to said control means.

4. The capacitive keyboard apparatus according to claim 3, wherein said control means supplies a control signal to said first and second logic operation means, said first logic operation means does not output the results of the logic operation while said drive signal supplying means is supplying the second drive signal, and said second logic operation means does not output the results of the logic operation while said drive signal supplying means is supplying the first drive signal.

5. The capacitive keyboard apparatus according to claim 4, wherein said first logic operation means performs an AND operation on the signal output from said first delay means, the logic signal and the control signal, and said second logic operation means performs an AND operation on the signal output from said second delay means, the logic signal and the control signal.

6. The capacitive keyboard apparatus according to claim 5, wherein said first period of time is 2.5 to 3 microseconds, and said second period of time is about 1 microseconds.

7. The capacitive keyboard apparatus according to claim 1, wherein when said first judging means determined that the logic signal which is generated from the matrix output signal corresponding to said first signal and is converted at said signal converting means has a pulse width broader than the first predetermined width, said control means causes said drive signal supplying means to supply the second drive signal to the column of said switch matrix which has received the matrix output signal corresponding to the first drive signal, and causes said selection means to select the row of said switch matrix which has received the matrix output signal corresponding to the first drive signal.

8. The capacitive keyboard apparatus according to claim 7, wherein said first judging means comprises first delay means for outputting a signal having a predetermined pulse width upon lapse of a first period of time after any logic signal has been generated, and first logic operation means for performing a logic operation on the signal output from said first delay means and the logic signal, and supplying the results of the logic operation to said control means; and said second judging means comprises second delay means for outputting a signal having a predetermiend pulse width upon lapse of a second period of time after any logic signal has been generated, said second period of time being shorter than the first period of time, and second logic operation means for performing a logic operation on the signal output from said second delay means and the logic signal, and supplying the results of the logic operation to said control means.

9. The capacitive keyboard apparatus according to claim 8, wherein said control means supplies a control signal to said first and second logic operation means, said first logic operation means does not output the results of the logic operation while said drive signal supplying means is supplying the second drive signal, and said second logic operation means does not output the results of the logic operation while said drive signal supplying means is supplying the first drive signal.

10. The capacitive keyboard apparatus according to claim 9, wherein said first logic operation means performs and AND operation on the signal output from said first delay means, the logic signal and the control signal, and said second logic operation means performs an AND operation on the signal output from said second delay means, the logic signal and the control signal.

11. The capacitive keyboard apparatus according to claim 10, wherein said first period of time is 2.5 to 3 microseconds, and said second period of time is about 1 microseconds.

12. The capactive keyboard apparatus according to claim 7, wherein said control means outputs a first sampling pulse to said first judging means upon lapse of a first period of time after the first drive signal has been generated, and outputs a second sampling pulse to said second judging means upon lapse of a second period of time after the second drive signal has been generated, and said second period of time being shorter than the first period of time, said first judging means performs an AND operation on the first sampling pulse and the logic signal, and supplying the results of the AND operation to said control means, and said second judging means performs an AND operation on the second sampling pulse and the logic signal, and supplying the results of the AND operation to the control means.

13. The capacitive keyboard apparatus according to claim 12, wherein said control means outputs the first sampling pulse while said first drive signal is being generated, and outputs the second sampling pulse while said second drive signal is being generated.

14. The capacitive keyboard apparatus according to claim 13, wherein said first period of time is 2.5 to 3 microseconds, and said second period of time is about 1 microseconds.

* * * * *